US006650258B1

(12) United States Patent
Kelly et al.

(10) Patent No.: US 6,650,258 B1
(45) Date of Patent: Nov. 18, 2003

(54) SAMPLE RATE CONVERTER WITH RATIONAL NUMERATOR OR DENOMINATOR

(75) Inventors: Anthony Kelly, Limerick (IE); Jeffrey C. Gealow, Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/213,298

(22) Filed: Aug. 6, 2002

(51) Int. Cl.$^7$ ................................................ H03M 7/00
(52) U.S. Cl. ...................................................... 341/61
(58) Field of Search ............................ 341/61, 118, 143, 341/144, 155

(56) References Cited

U.S. PATENT DOCUMENTS 6,522,275 B2 * 2/2003 May ........................... 341/143
6,531,970 B2 * 3/2003 McLaughlin ................. 341/61

* cited by examiner

*Primary Examiner*—Brian Young
(74) *Attorney, Agent, or Firm*—Wolf, Greenfield & Sacks, PC (57) ABSTRACT

A sample rate conversion system developed to implement a rate change of M/N using a very efficient design implementation. The sample rate conversion system of the present invention is implemented as a CIC-based interpolating sample rate converter with noise-shaped control of the N value. For a decimator, noise-shaped control of the M value is utilized. In the interpolator, the N value is the correct value on average, but demonstrates instantaneous errors ("non-uniform" resampling) that are corrected through noise-shaping. The CIC SRC implementation capitalizes on the fact that the outputs of the CIC that are discarded during downsampling need not be calculated by the CIC in the first instance. The combination of the computational simplicity of CIC SRC with noise-shaped, non-uniform resampling performs the sample rate conversion very economically and facilitates conversion between a plethora of sample rates at the input and output without requiring the various filters to be explicitly formulated. A method for sample rate conversion is also described.

24 Claims, 10 Drawing Sheets

| SR in (kHz) | SR out (MHz) |
|---|---|
| 8 *32 | 12.288 / 5 |
| 11.025 *32 | 13 / 5 |
| 12 *32 | 13.824 / 5 |
| 16 *32 | 14.4 / 6 |
| 22.05 *32 | 15.36 / 6 |
| 24 *32 | 16.8 / 6 |
| 32 *32 | 17.28 / 7 |
| 44.1 *32 | 19.2 / 7 |
| 48 *32 | 19.44 / 7 |
|  | 19.68 / 8 |
|  | 19.8 / 8 |

| Fmclk (MHz) | Div | Fana (MHz) | VI | Vr | n (Freq Mod) | d (Freq Mod) |
|---|---|---|---|---|---|---|
| 12.288 | 5 | 2.457 | 183 | 3/4 | 11872575 | |
| 13 | 5 | 2.6 | 173 | 223/325 | 10861884 | |
| 13.824 | 5 | 2.7648 | 163 | 1/3 | 5276700 | |
| 14.4 | 6 | 2.4 | 188 | 4/25 | 2532816 | |
| 15.36 | 6 | 2.56 | 176 | 2/5 | 6332040 | |
| 16.8 | 6 | 2.8 | 161 | 7/25 | 4432428 | 15830100 |
| 17.28 | 7 | -2.47 | 182 | 14/15 | 14774760 | |
| 19.2 | 7 | -2.74 | 164 | 16/25 | 10131264 | |
| 19.44 | 7 | -2.78 | 162 | 82/135 | 9615320 | |
| 19.68 | 8 | 2.46 | 183 | 117/205 | 9034740 | |
| 19.8 | 8 | 2.475 | 182 | 126/275 | 7253064 | |

FIG. 9

| Fi (kHz) | AUDIO | VB | D2 | Fmod | Fsrc (Hz) | LCM (Fsrc) | I | V |
|---|---|---|---|---|---|---|---|---|
| 8 | * | * | 4 | 0.6–0.7MHz | 256k | 451.584 MHz/4 | 441 | |
| 11.025 | * | | | | 352.8k | | 320 | |
| 12 | * | | | | 384k | | 294 | |
| 16 | * | * | 2 | 1.2–1.4MHz | 512k | 451.584 MHz/2 | 441 | 161.28–188.16 |
| 22.05 | * | | | | 705.6k | | 320 | |
| 24 | * | | | | 768k | | 294 | |
| 32 | * | | 1 | 2.4–2.8MHz | 1.024M | 451.584 MHz | 441 | |
| 44.1 | * | | | | 1.4112M | | 320 | |
| 48 | * | | | | 1.536M | | 294 | |

SAMPLE RATE CONVERTER WITH RATIONAL NUMERATOR OR DENOMINATOR

FIELD OF THE INVENTION

This invention relates generally to sample rate converters and in particular to cascaded integrator-comb (CIC) filters used in sample rate conversion applications, and is more particularly directed toward a resampling CIC filter that interpolates or decimates a signal by a factor of M/N. For an interpolator N may be a rational number whilst M may be a natural number. For a decimator M may be a rational number whilst N may be a natural number.

BACKGROUND OF THE INVENTION

Historically, data rate conversions have ranged from simple compression and expansion of digital data streams to actual sample rate multiplication suitable for oversampling data conversion applications. In modern systems, sample rate conversion is an integral aspect of transmitter and receiver signal processing ICs (integrated circuits) designed for baseband and IF signal processing for digital modulation schemes.

Early data rate adjustment mechanisms, such as that disclosed in U.S. Pat. No. 4,893,339, to Bright et al., were often employed so that portions of a digital data stream could be replaced with other information without altering the net data rate. Similar schemes are also used in telephony to accommodate certain types of signaling bits.

In the Bright et al. patent, bits are discarded periodically from an input data stream in order to make room for a necessary block of additional data bits. Fortunately, because of inherent redundancy in the relatively low rate voice coder of Bright et al., little significant information is lost during the compression operation. At the receiver, the original voice stream is reconstructed by simple bit insertion using an empirically derived algorithm. Simple digital companding schemes such as this do not work well with more complex voice coders, such as LPC (linear predictive coding) based coders.

As noted, oversampling data conversion systems generally include an interpolator that increases the sampling rate of a digital input sample stream. Interpolation generally consists of taking one sequence a(n) and producing another sequence b(m) whose samples occur r times as fast. Interpolation is a necessary step in sigma-delta conversion systems that operate on a high frequency bit stream.

As data conversion systems become faster and faster, narrow-band extraction from wideband sources is becoming commonplace, as is wideband construction of narrow-band signals. It has become commonplace to implement sample rate conversion by integer factors using cascaded integrator-comb (CIC) filters to perform basic interpolation and decimation operations. The use of CIC techniques facilitates conversion between multiple sample rates, without the need for multiple filters in hardware, where each value of rate change requires a different filter to be realized.

In order to facilitate a rational rate change of M/N, an integer interpolator by M is cascaded with an integer decimation of N. Prior art systems generally permit rate conversions by a factor of M/N, where both M and N are constrained to be natural numbers. For systems with a large number of selectable input and output sample rates, an integer constraint on both M and N can result in values well into the millions, with unworkably large bit growth. Consequently, a need arises for an efficient and realistic implementation that will provide an M/N rate change with N rational for an interpolating SRC (sample rate converter) or M rational for a decimating SRC.

SUMMARY OF THE INVENTION

These needs and others are satisfied by the sample rate converter of the present invention. The discussion of the present invention focuses on an interpolating SRC, but a decimating SRC based upon the same principles has also been demonstrated.

Figure 3:
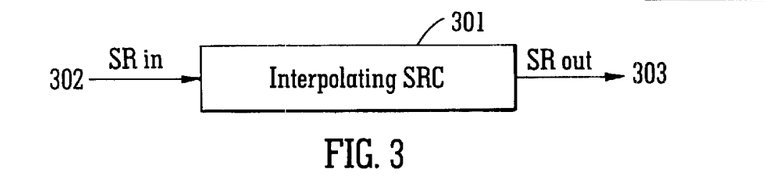
FIG. 3 shows an interpolating SRC in accordance with the present invention.
Figure 4:
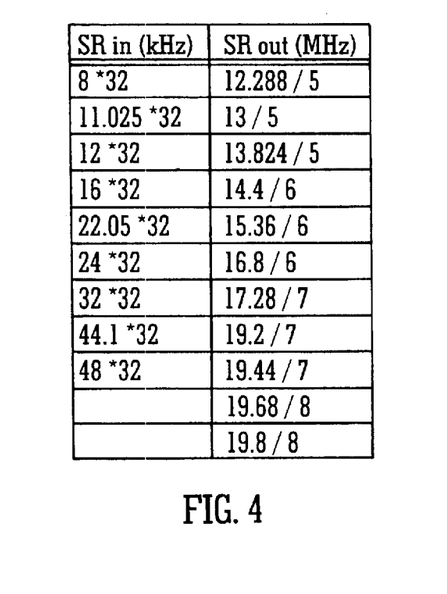
FIG. 4 is a table of input and output sample rates for an exemplary system.

The SRC 301 (FIG. 3) of the present invention was developed to implement a rate change of M/N using a very efficient design implementation. For the digital signal processing datapaths described herein, there are 11 different sample rates at the output 303 of the interpolating SRC 301 that must be matched to one of 9 sample rates at the input 302. The input and output sample rates are shown in the table of FIG. 4. Constraining M and N to integer values would yield values well into the millions, with concomitant unworkably large bit growth. As an example, rate converting 44.1 kHz*32 at the input to 13 MHz/5 at the output would require M=104000, and N=56448.

Allowing multiple, selectable values for M in the interpolator, or N in the decimator, requires different filter characteristics. Rather than implement several individual filters, the CIC approach locates the pole and zeros as a consequence of the algorithm.

The solution described utilizes a CIC-based interpolating sample rate converter with noise-shaped control of the N value. For a decimator, noise-shaped control of the M value is utilized. In the interpolator, the N value is the correct value on average, but demonstrates instantaneous errors that must be noise-shaped. This is an example of so-called "non-uniform" resampling. The CIC SRC implementation capitalizes on the fact that the outputs of the CIC that are discarded during downsampling need not be calculated by the CIC in the first instance. The combination of the computational simplicity of CIC SRC with noise-shaped, non-uniform resampling performs the sample rate conversion very economically.

Figure 5:
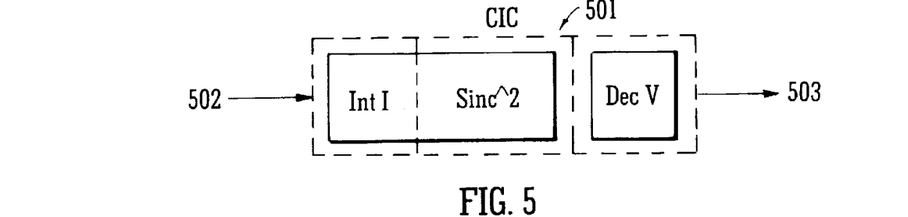
FIG. 5 is a block diagram of an interpolating CIC in conjunction with a downsampler, to form an interpolating SRC in accordance with the present invention.

A CIC interpolator in conjunction with a downsampler, to form an interpolating SRC, is illustrated in block diagram form in FIG. 5. As shown, the CIC filter 501 upsamples the input data stream 502 by a factor of M, and displays a filter power spectrum proportional to $sinc^2$. The reshaped, upsampled signal is then downsampled by N to produce the output data stream 503.

Figure 6:
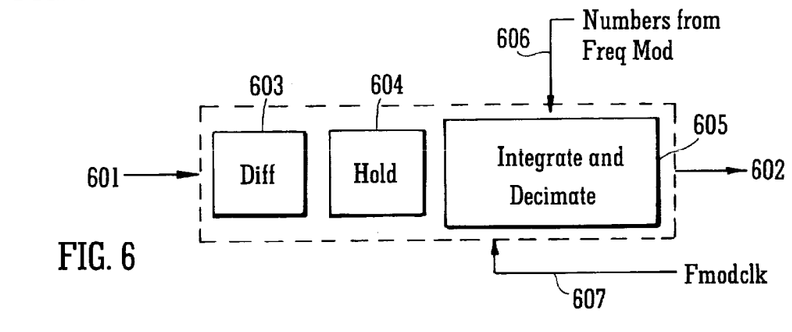
FIG. 6 is a block diagram of the interpolating SRC of FIG. 5.

As illustrated in FIG. 6, the interpolating SRC operates on the input data stream 601 through differentiate 603 and hold 604 sections, at the input rate, then the integrate and decimate section 605 operates on the data stream to produce output samples at the output rate.

Figure 7:
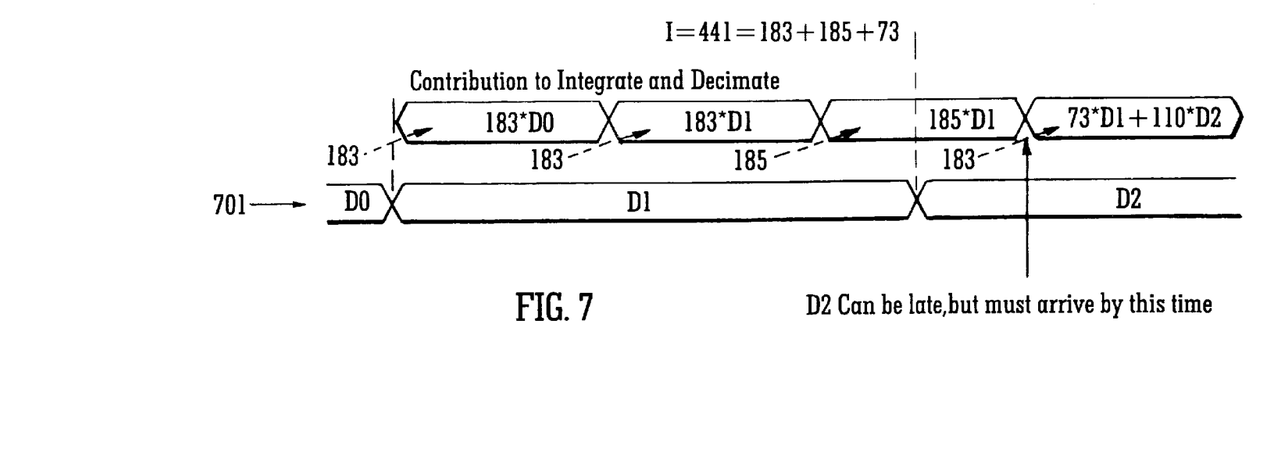
FIG. 7 is a timing diagram illustrating operation of the interpolating SRC of FIG. 6.

The timing diagram of FIG. 7 illustrates the values by which the $D_N$ values 701 of the input data stream are multiplied. M is equal to 441, while the instantaneous N values are 183, 185, and 183. The values by which the $D_N$ are multiplied (183, 185, 73, as illustrated) are calculated on-the-fly, as the numbers are supplied by the associated digital sigma-delta modulator (606 in FIG. 6) so as to fix the location of the pole and zeroes of the interpolator's transfer function. Conceptually, the interpolation achieved by the CIC is fixed (441, in the example shown) while the downsampling varies instantaneously without affecting the operation of the CIC.

In accordance with one aspect of the present invention, an improved interpolating sample rate converter is provided that operates on an input data stream to perform upsampling, filtering, and downsampling of the input data stream to produce an output data stream having a higher sample rate than the input data stream. A cascaded integrator-comb filter performs at least a part of the upsampling and filtering of the input data stream, and downsampling is conducted at an instantaneously variable rate. Downsampling may be conducted at an instantaneously variable rate through a digital sigma-delta modulator that controls downsampling on a sample-by-sample basis to implement non-uniform downsampling. Preferably, the output of the sigma-delta modulator is divided to provide a clock signal having a fixed frequency and a non-uniform period.

In accordance with another aspect of the present invention, an improved decimating sample rate converter is provided that operates on an input data stream to perform upsampling, filtering, and downsampling of the input data stream to produce an output data stream having a lower sample rate than the input data stream. A cascaded integrator-comb filter performs at least a part of the filtering and downsampling of the input data stream, and upsampling is conducted at an instantaneously variable rate. Upsampling may be conducted at an instantaneously variable rate through a digital sigma-delta modulator that controls upsampling on a sample-by-sample basis to implement non-uniform upsampling. Preferably, the output of the sigma-delta modulator is divided to provide a clock signal having a fixed frequency and a non-uniform period.

In accordance with yet another aspect of the present invention, an interpolating sample rate converter that provides rate conversion by a factor of M/N comprises an upsampler that upsamples an input data stream by a factor of M, a filter that shapes the upsampled data stream in accordance with a predetermined power spectrum, and a downsampler that downsamples the upsampled and shaped signal by a factor of N to produce an output data stream. The upsampler and filter are implemented, at least in part, by a cascaded integrator-comb filter. The upsampling factor M is an integer and the downsampling factor N is not an integer. Preferably, the predetermined power spectrum is proportional to $sinc^2$.

In accordance with still another aspect of the present invention, the interpolating sample rate converter further comprises a sigma-delta modulator that provides noise-shaped control of the N value for the downsampler. Preferably, the sigma-delta modulator controls downsampling on a sample-by-sample basis to implement non-uniform downsampling. The output of the sigma-delta modulator may be divided to provide a clock signal having a fixed frequency and a non-uniform period.

In accordance with yet a further aspect of the present invention, a decimating sample rate converter that provides rate conversion by a factor of M/N comprises an upsampler that upsamples an input data stream by a factor of M, a filter that shapes the upsampled data stream in accordance with a predetermined power spectrum, and a downsampler that downsamples the upsampled and shaped signal by a factor of N to produce an output data stream. The filter and downsampler are implemented, at least in part, by a cascaded integrator-comb filter. The upsampling factor M is not an integer and the downsampling factor N is an integer. Preferably, the predetermined power spectrum is proportional to $sinc^2$.

In another form of the invention, the decimating sample rate converter further comprises a sigma-delta modulator that provides noise-shaped control of the M value for the upsampler. Preferably, the sigma-delta modulator controls upsampling on a sample-by-sample basis to implement non-uniform upsampling. The output of the sigma-delta modulator may be divided to provide a clock signal having a fixed frequency and a nonuniform period.

In accordance with still another aspect of the invention, a method for sample rate conversion of a digital input signal comprises the steps of providing an input digital data stream at an input sample rate, filtering and interpolating the input digital data stream by an integer value I utilizing, at least in part, a cascaded integrator-comb filter, and decimating the interpolated input digital data stream by an instantaneously variable value V to provide an output digital data stream at an output sample rate. The step of decimating the interpolated input digital data stream by an instantaneously variable value V may further comprise the step of deriving the instantaneously variable value V through a digital sigma-delta modulator that controls downsampling on a sample-by-sample basis to implement non-uniform downsampling.

In accordance with yet a further aspect of the present invention, a method for sample rate conversion of a digital input signal comprises the steps of providing an input digital data stream at an input sample rate, interpolating the input digital data stream by an instantaneously variable value V, and filtering and decimating the interpolated input digital data stream by a value I utilizing, at least in part, a cascaded integrator-comb filter, to provide an output digital data stream at an output sample rate. The step of interpolating the input digital data stream by an instantaneously variable value V may further comprise the step of deriving the instantaneously variable value V through a digital sigma-delta modulator that controls upsampling on a sample-by-sample basis to implement non-uniform upsampling.

In accordance with yet another aspect of the invention, a sample rate converter for a digital input signal comprises means for providing an input digital data stream at an input sample rate, means for filtering and interpolating the input digital data stream by an integer value I utilizing, at least in part, a cascaded integrator-comb filter, and means for decimating the interpolated input digital data stream by an instantaneously variable value V to provide an output digital data stream at an output sample rate The means for decimating the interpolated input digital data stream by an instantaneously variable value V may comprise means for deriving the instantaneously variable value V through a digital sigma-delta modulator means that controls downsampling on a sample-by-sample basis to implement non-uniform downsampling.

In accordance with still a further aspect of the invention, a sample rate converter for a digital input signal comprises means for providing an input digital data stream at an input sample rate, means for interpolating the input digital data stream by an instantaneously variable value V, and means for filtering and decimating the interpolated input digital data stream by a value I utilizing, at least in part, a cascaded integrator-comb filter, to provide an output digital data stream at an output sample rate. The means for interpolating the input digital data stream by an instantaneously variable value V may comprise means for deriving the instantaneously variable value V through a digital sigma-delta modulator means that controls upsampling on a sample-by-sample basis to implement non-uniform upsampling.

Further objects, features, and advantages of the present invention will become apparent from the following description and drawings.

DETAILED DESCRIPTION OF THE INVENTION

There is described herein a sample rate converter that offers distinct advantages when compared to the prior art. It may be helpful to recall that in digital systems, the term "decimate" ordinarily refers to a reduction in sample rate consistent with the width of the band to be transmitted. "Interpolate" generally applies to increasing the sample rate and smoothing of the decoder output at the receiver. Interpolation consists of taking one sequence a(n) and producing another sequence b(m) whose samples occur r times as fast. Decimation is the process of sample rate reduction, that is, starting with the sequence b(m) and producing a sequence a(n) from it.

Matthew P. Donadio, in his CIC Filter Introduction, notes that these two basic signal processing procedures, decimation and interpolation, are key to efficient narrow-band extraction from wideband sources. Hogenauer (See An Economical Class of Digital Filters for Decimation and Interpolation) has devised a flexible, multiplier-free filter suitable for hardware implementation that can also handle arbitrary and large rate changes. These are known as cascaded integrator-comb filters, or CIC filters, for short.

The two basic building blocks of a CIC are an integrator and a comb. An integrator can be implemented as a single-pole IIR (infinite impulse response) filter with a unity feedback coefficient. A comb filter running at a high sampling rate $f_s$ for a rate change of R is an FIR (finite impulse response) filter having a differential delay M (usually limited to 1 or 2).

For the integrator, the power response is basically a low-pass filter with a roll-off of 20 dB per decade (6 dB per octave). In other words, a single-pole filter. The comb filter is generally a raised-cosine when RM is not equal to one.

In constructing a CIC filter, one cascades, or chains output to input, N integrator sections together with N comb sections. One can actually simplify this filter by combining it with the rate changer. Essentially, one "pushes" the comb sections through the rate changer. This results in slowing down half the filter, reducing the number of delay elements needed in the comb sections, and rendering the integrator and comb structure independent of the rate change. One can thus design a CIC filter with a programmable rate change and keep the same filtering structure.

Figure 1:
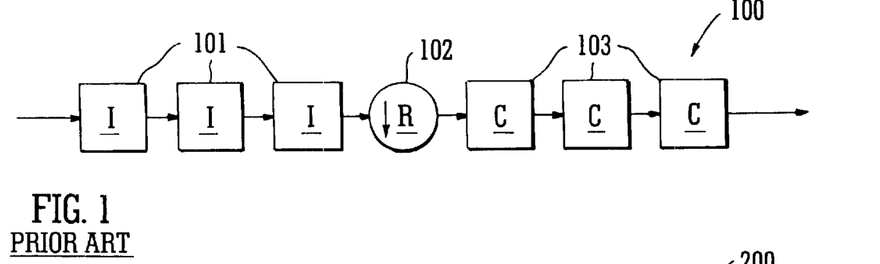
FIG. 1 illustrates, in simplified block diagram form, a cascaded integrator-comb decimator as known in the art.
Figure 2:
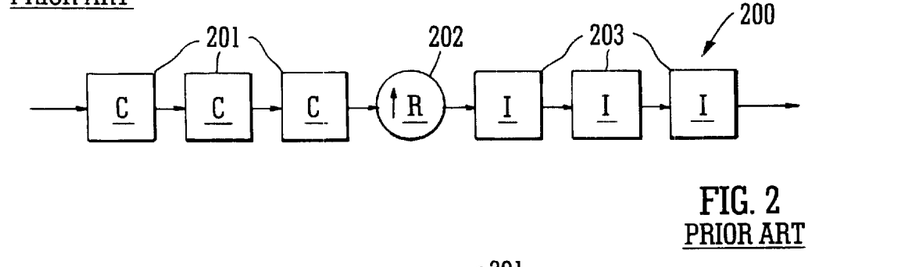
FIG. 2 depicts a CIC interpolator of the prior art.

The CIC decimator 100 of FIG. 1 would have N cascaded integrator stages 101 clocked at $f_s$, followed by a rate change 102 by a factor R, followed by N cascaded comb stages 103 running at $f_s/R$. The CIC interpolator 200 of FIG. 2 would be N cascaded comb stages 201 running at $f_s/R$, followed by a zero-stuffer 202, followed by N cascaded integrator stages 203 running at $f_s$.

Figure 8:
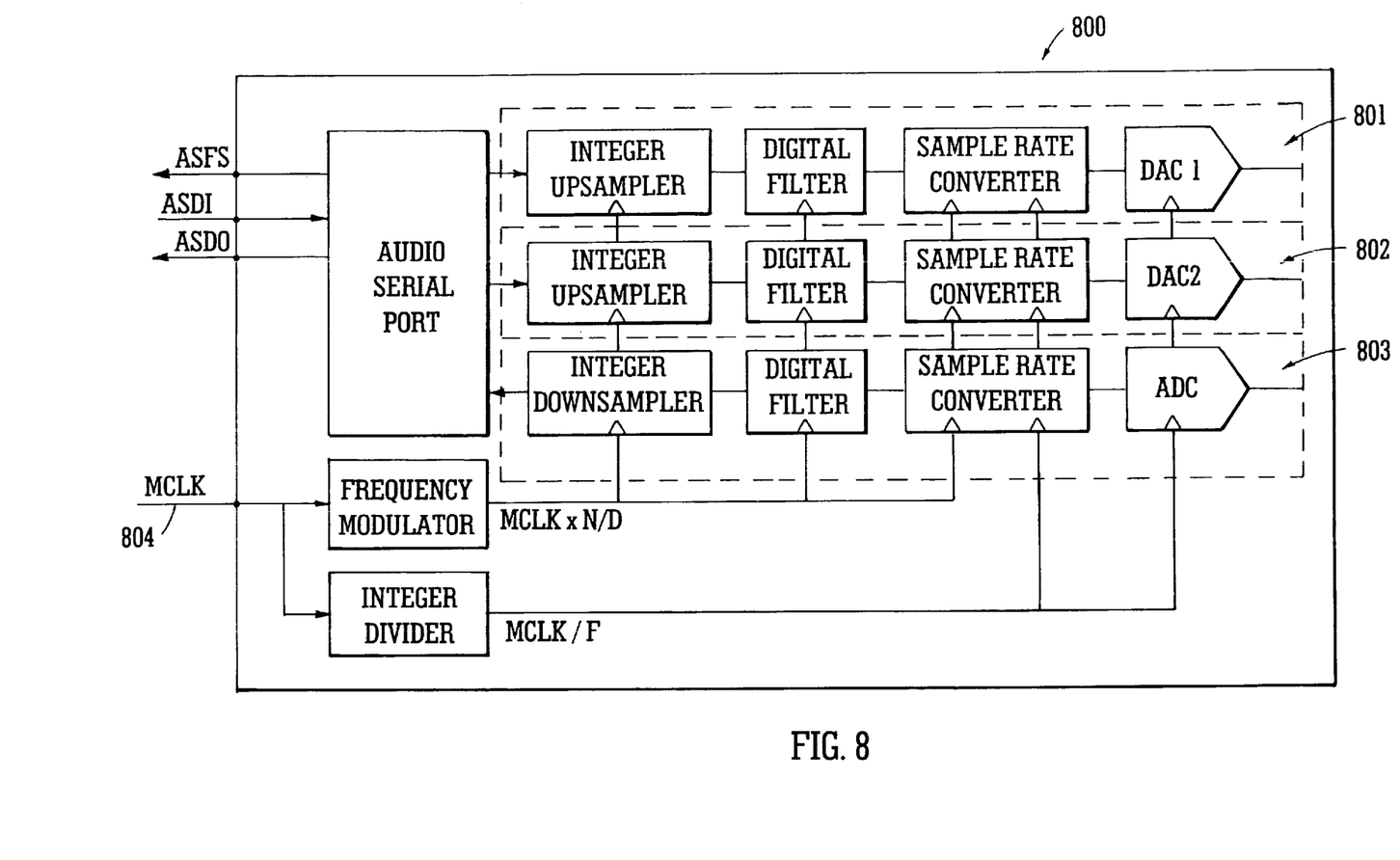
FIG. 8 represents, in block diagram form, an exemplary signal processing system incorporating an SRC in accordance with the present invention.

The sample rate converter of the present invention is included in the audio codec (coder/decoder) illustrated in block diagram form in FIG. 8, and generally depicted by the numeral 800. The audio codec 800 supports both communications applications in the voice band and personal audio applications for different sample rates.

Three digital signal data paths 801–803 are illustrated in the exemplary codec 800. Two of the data paths 801, 802 support digital to analog conversion, while the third data path 803 supports analog to digital conversion. The various sample rates supported by the system have been chosen to best support the various modes of operation.

Figure 9:
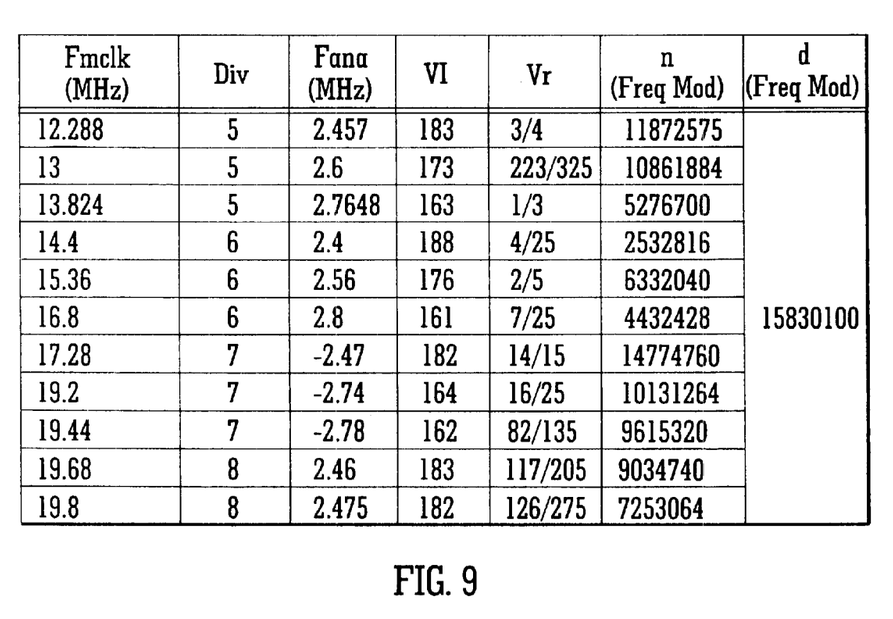
FIG. 9 is a table of system constants utilized for an interpolating SRC in the system of FIG. 8.

MCLK 804 refers to the master clock of the system which can take on any of the 11 values shown in the first column of the table of FIG. 9. The variable F can be defined as D1*D2, where D2 is shown for every category in column 4 of the table of FIG. 10. The variable D1 (or Div) is shown in column 2 of the table of FIG. 9. The variables D1 and D2 were chosen to facilitate dividing MCLK by simple integer dividers. Of course, the internal scaling may be modified without affecting system operation. For example, the frequency modulator may be clocked with MCLK/F instead of MCLK.

Figure 11:
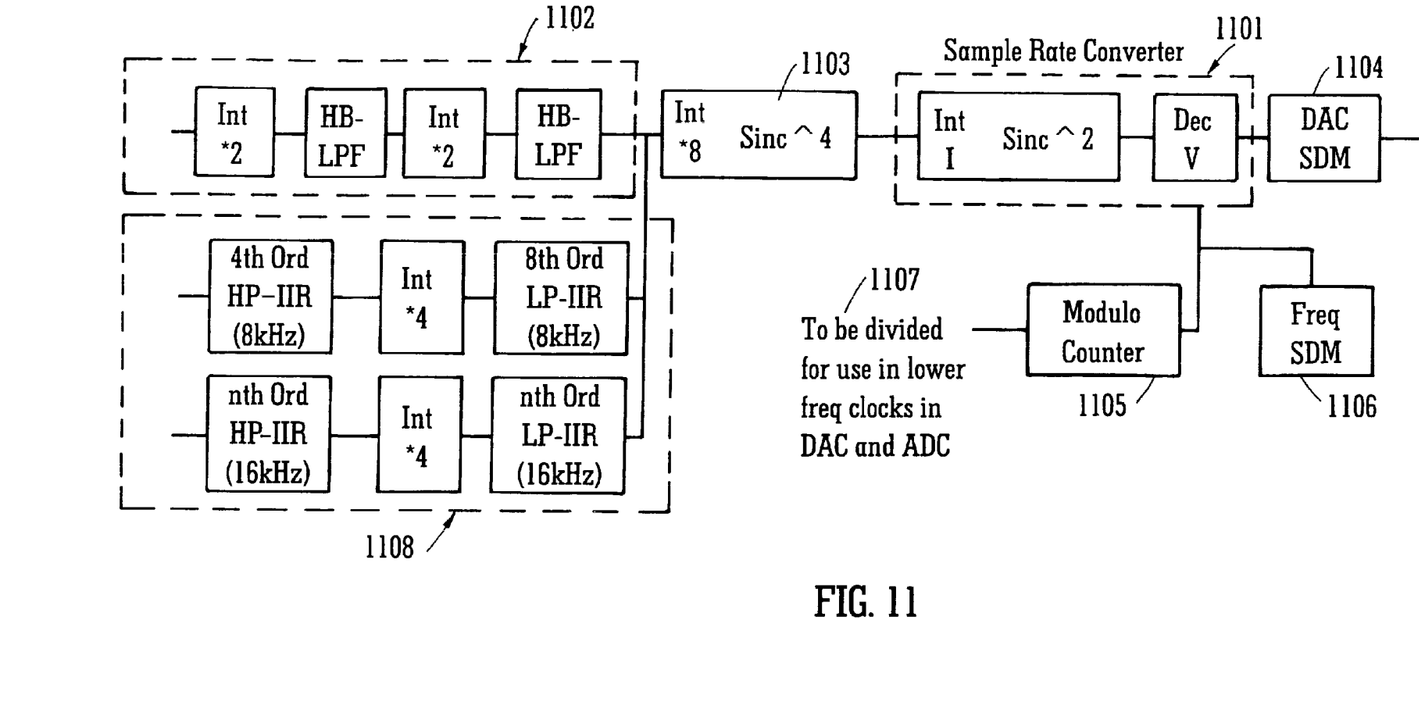
FIG. 11 is a block diagram of an interpolating SRC as implemented in the system of FIG. 8.

The DAC data path (decoder) 801 of FIG. 8 is illustrated in greater detail in the block diagram of FIG. 11. The sample rate converter 1101 in the DAC data path is primarily to convert the sampling rate of the data at Fsrc to MCLK/F. This is achieved using the relation MCLK/F=Fsrc*I/V. Ideally speaking, a clock running at the frequency of Fsrc*I is needed in order to be able to interpolate the input data, but as that clock frequency is highly impractical, it is prudent to avoid its generation through the technique described herein.

The concept behind the operation of the sample rate converter can be understood qualitatively as follows. Instead of having the data differentiated twice at the input sample rate (due to the second order sync), interpolated by I (ideally by inserting zeros), integrated twice, then taking every other Vth sample of the result in order to decimate by V, the data is instead multiplied by the corresponding V value at the same sampling instants. This data directly follows from the fact that a second order sinc in the frequency domain is the Fourier transform of a ramp in the time domain.

The decoder of FIG. 11 includes interpolation and filtering in blocks 1102, 1108, and 1103, to convert the input sample rate to Fsrc and apply the required filtering characteristics to the signal. Block 1102 of FIG. 11 is made up of two stages of interpolate-by-2 half-band filters, to yield a total interpolation of four in this block, applying the desired filtering in the audio modes, as indicated in FIG. 10.

Figure 10:
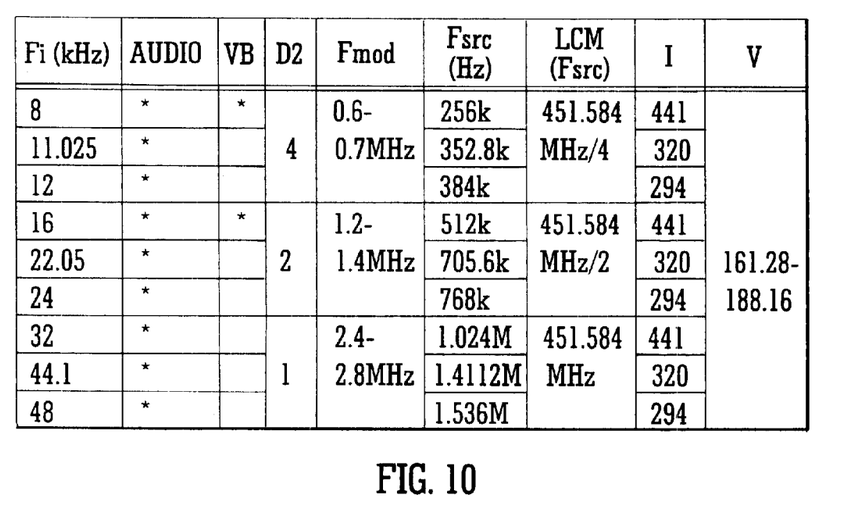
FIG. 10 is a table of system constants associated with each of the input sample rates for which the system of FIG. 8 is adapted to be used.

Block 1108 of FIG. 11 provides the filtering and interpolation by four, which is required for the Voice modes of FIG. 10. There are two voice modes, 8 kHz input sample rate and 16 kHz input sample rate. The 16 kHz sample rate input is processed by the elements in block 1108 that are indicated as 16 kHz. The 8 kHz sample rate input is processed by the elements in block 1108 that are indicated as 8 kHz.

Having interpolated by four in blocks 1102 or 1108 of FIG. 11 (depending upon whether a voice or audio mode has been selected), the remaining interpolation by 8, to achieve an overall interpolation of 32, is performed in block 1103, which is a CIC integer rate interpolator with a $sinc^4$ frequency domain filtering characteristic.

Block 1104 of FIG. 11 is a digital sigma-delta modulator with third order noise-shaping, which reduces the noise in the band of interest, allowing the overall decoder to achieve high resolution once the noise at frequencies much higher than the band of interest has been removed by subsequent filtering in the analog domain.

The non-uniform downsampling in the decoder of FIG. 11 is facilitated by the frequency sigma-delta modulator (SDM) 1106. The frequency SDM inputs data to the SRC 1101 at the Fmod rate, controlling the downsampling part of the SRC on a sample-by-sample basis.

The modulo counter 1105 uses the output from the frequency SDM 1106 to divide a clock at the Fmod rate by I/V, producing a clock with a non-uniform period that is equal in frequency to Fsrc. This clock is further sub-divided to produce clocking signals 1107 throughout the signal chain for both the decoder of FIG. 11 and the encoder of FIG. 12.

Figure 12:
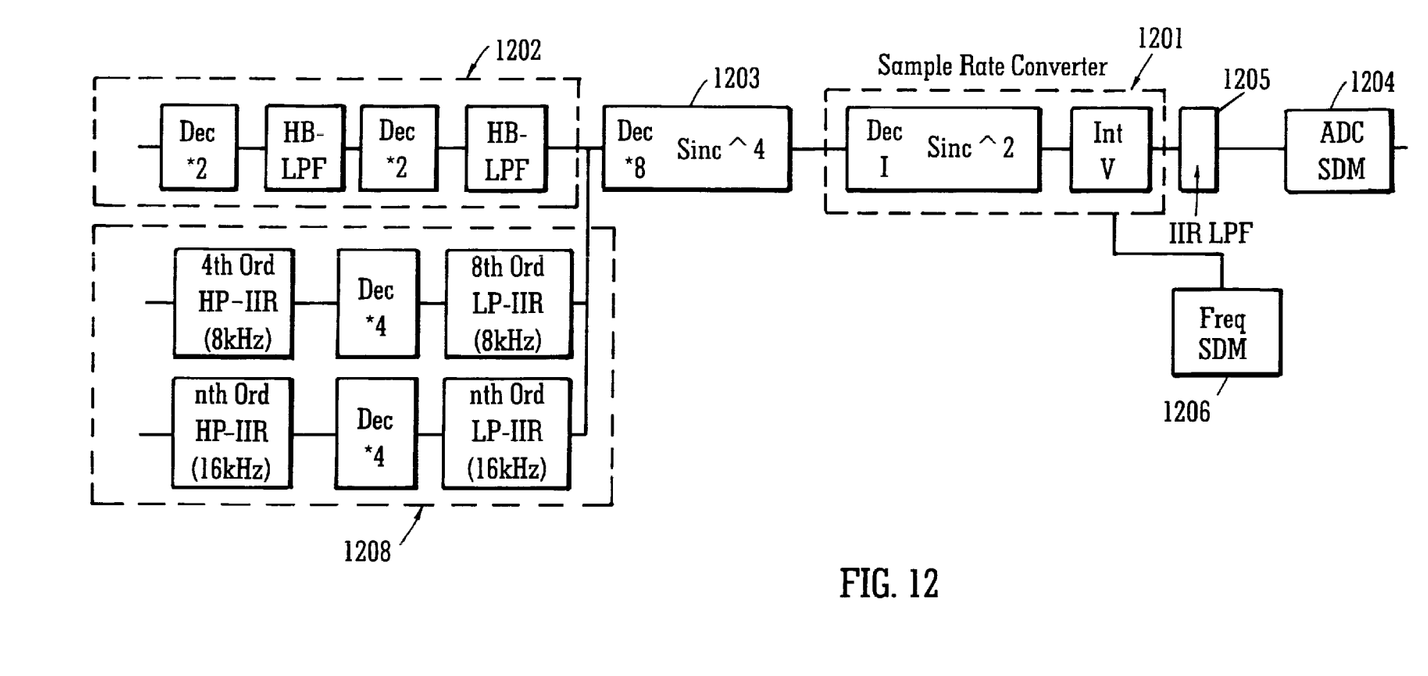
FIG. 12 is a block diagram of a decimating SRC as implemented in the system of FIG. 8.

The encoder is illustrated in FIG. 12, incorporating an analog sigma-delta modulator 1204, a low pass filter to filter the output of the analog SDM 1205, a decimating sample rate converter (SRC) in accordance with the present invention, followed by decimation and filtering for the voice and audio modes. As the decimation and filtering in the encoder is theoretically the dual of the decoder, the filtering in the blocks 1208 and 1202 of the encoder are the same as the filtering previously described for the decoder, but 1208 and 1202 perform decimation of their input signal. Block 1202 performs processing for audio equivalent to block 1102 previously described, and block 1208 performs processing for voice equivalent to block 1108 of FIG. 11. The frequency SDM 1206 of FIG. 12, block 1206, can be the same block in realization as block 1106.

Figure 13:
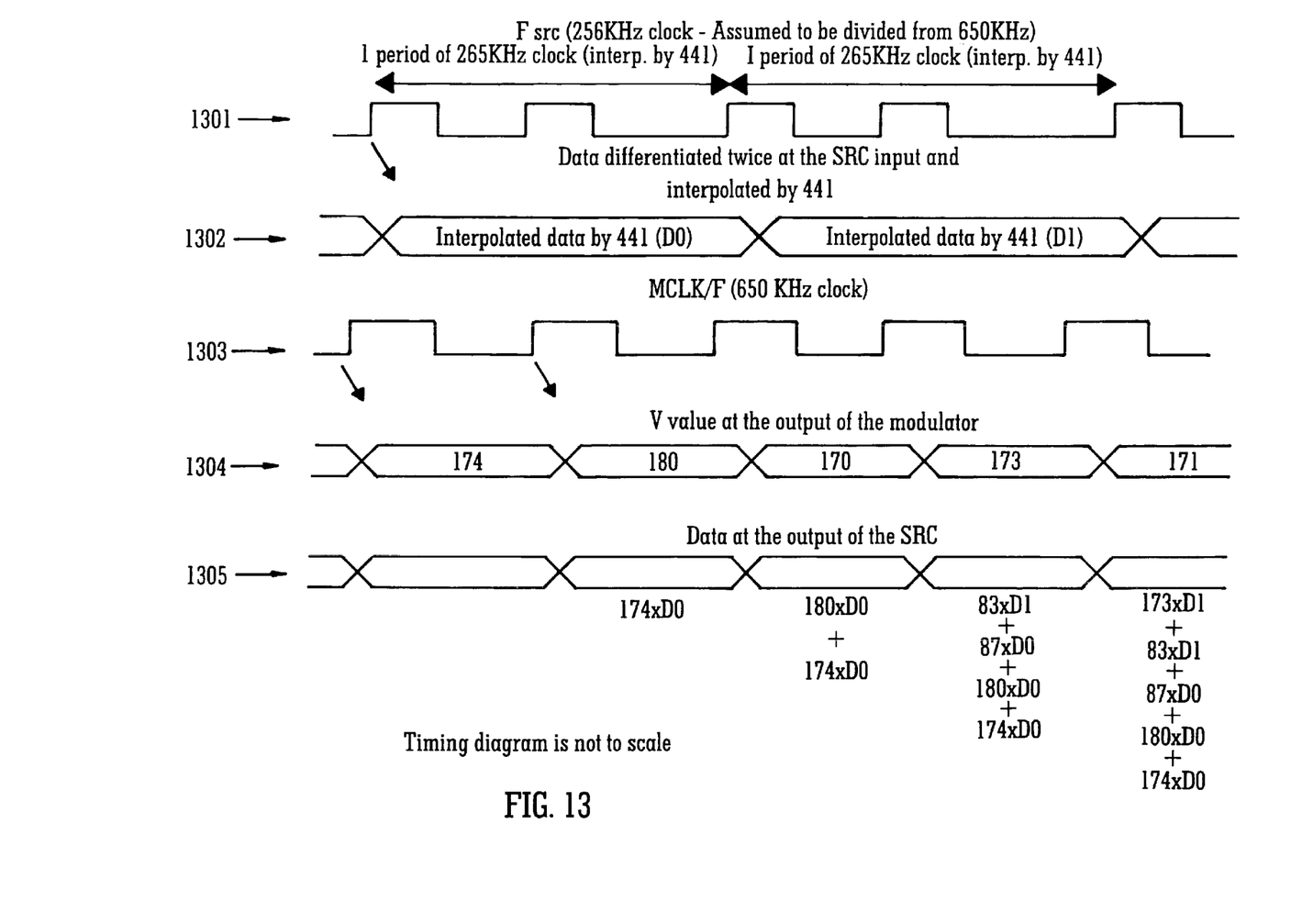
FIG. 13 shows signal timing diagrams illustrating operation of the interpolating SRC of FIG. 11.

The timing diagram of FIG. 13 illustrates the concept of operation of the sample rate converter in accordance with the present invention, as shown in FIG. 6 and in block 1101 of FIG. 11. The value of MCLK has a value of 13 MHz as an example, this means that MCLK/F equals to 650 kHz, assuming D2=4. The input sample rate being 8 kHz in this example implies that Fsrc should be 256 kHz at the input of the sample rate converter (8 kHz×32). The value of I is 441 and the value of V equals to 173.6861538 on average.

In the first timing diagram 1301 of FIG. 13, the value of the 256 kHz clock is assumed to be generated from the 650 kHz clock; that is, the exact non-integer value of the division is assumed to be exactly available, that is for a reason that will be described shortly. To aid the clarity of conceptual explanation, in FIG. 13, a clock of the value Fsrc*I (256 kHz×441) is also assumed to be available, and the input differentiated data can be interpolated by 441 using that clock, as illustrated in the conceptual signal 1302. The value of the decimation value, V, is available from the frequency modulator. In order for the sample rate converter to operate correctly, every Vth sample should be taken from the data in 1302. But as signal 1302 is not realizable, the output data is calculated as the input data differentiated, multiplied by the present V value, and added to the past history of these calculations. It is effectively mirroring the integration of the conceptual signal 1302, the result of which is decimated by the value V, which varies at the output sample rate. As the values of V are not integer multiples of I (441), then a situation is encountered where one must multiply part of the value of V by a certain data and the rest by another data such that the multipliers of the two data sum to the instantaneous value of V for that sample (83+87=170 in the example). This can be noticed in the fourth clock of MCLK/F (650 kHz).

The two multipliers (83 and 87 in the example), are calculated so that the multipliers associated with a specific input sample sum to I value. In FIG. 13, the multipliers associated with D0, as shown in the fourth cycle, are 87, 180 and 174. The sum of these is 441, which is the value of I. Having used 87 cycles of the conceptual data 1302 in the calculation of D0, 170−87=83 cycles need to be associated with D1 in the next output calculation. These relationships are vital in order to locate the pole and zeros of the CIC filter correctly in the frequency domain. FIG. 7 specifically illustrates these relationships.

In the real implementation of the SRC, the 256 kHz has a non-uniform period and is in phase with the 650 kHz clock. This means that at certain sampling instants of V, the correct value of the data at the input of the SRC may not be available. For that specific reason, a latency in the data might by needed in the channel in order to correctly weigh the data in the same manner as illustrated.

Figure 14:
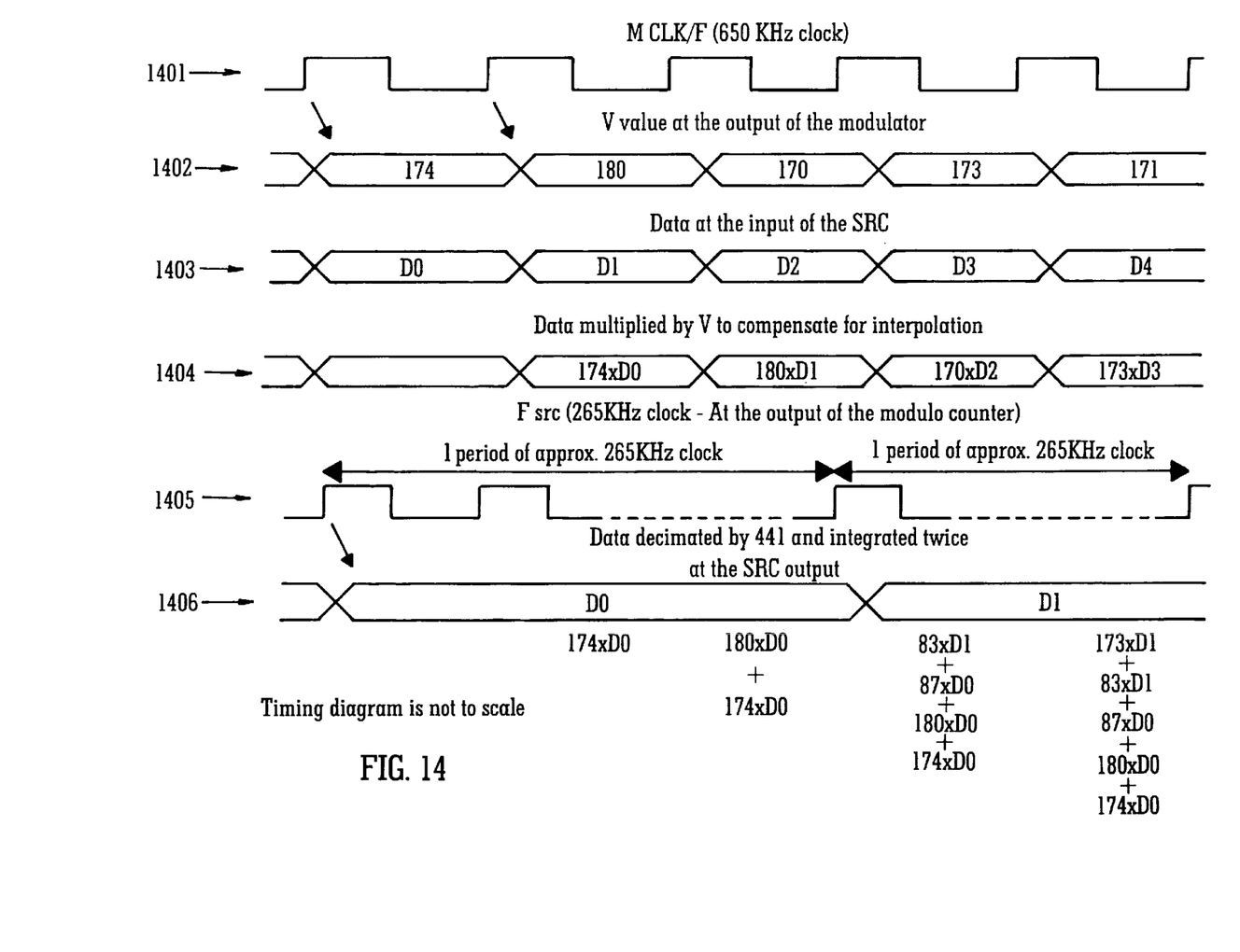
FIG. 14 shows signal timing diagrams illustrating operation of the decimating SRC of FIG. 12.
Figures 15, 16:
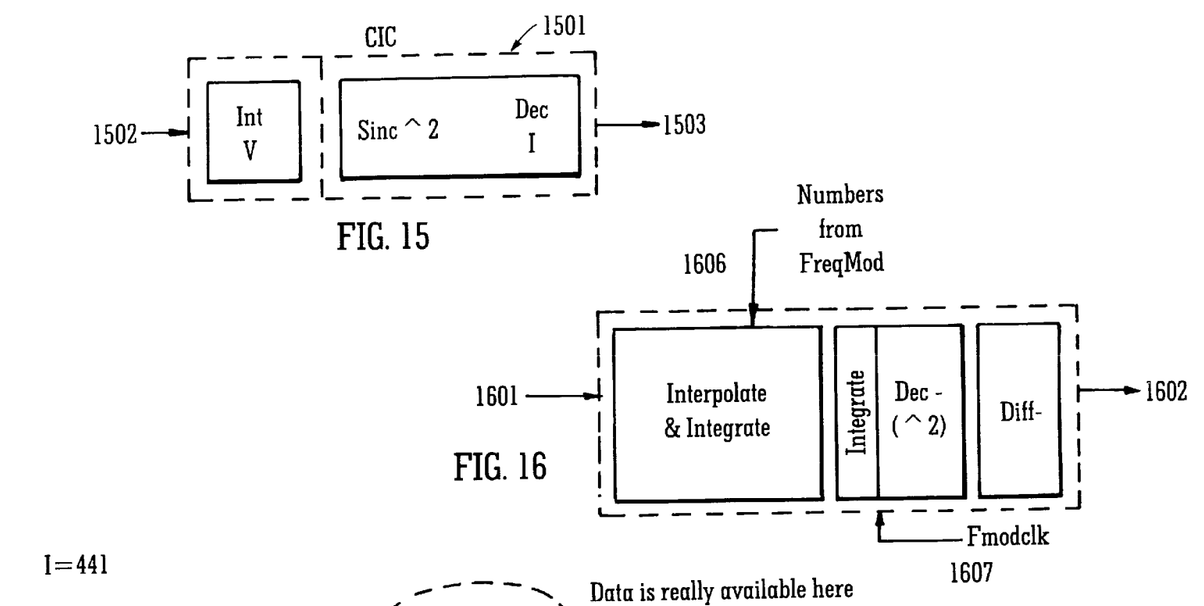
FIG. 15 is a block diagram of a decimating CIC preceded by an upsampler, to form a decimating SRC in accordance with the present invention.
FIG. 16 is a block diagram of the decimating SRC of FIG. 15.

FIG. 14 illustrates the timing and calculations associated with the decimating SRC in accordance with the present invention, as shown in FIG. 16 and block 1201 of FIG. 12. The input data 1403 is available at the Fmod rate of MCLK/F (650 kHz in the example of FIG. 14), and first needs to be interpolated and integrated. This is achieved by multiplying the input data 1403 by the corresponding V values 1402 to yield signal 1404. The data needs a further integration and decimation to yield signal 1406. This is the same integrate and decimate action described in conjunction with FIG. 13 for the interpolating SRC of FIG. 6. Two stages of differentiation are required to complete the processing of the data through the decimating SRC.

A block diagram illustrating the overall action of the decimating SRC is shown in FIG. 15. It comprises an upsampler 1502, followed by a CIC-based $sinc^2$ filtering and decimation 1503, where the upsampling may be non-uniform.

The details of the decimating SRC are illustrated in the block diagram of FIG. 16, where part of the CIC integration is combined with the upsampling, followed by integrate and decimate of a CIC which is then applied to two differentiate stages in order to complete the CIC operation.

Figure 17:
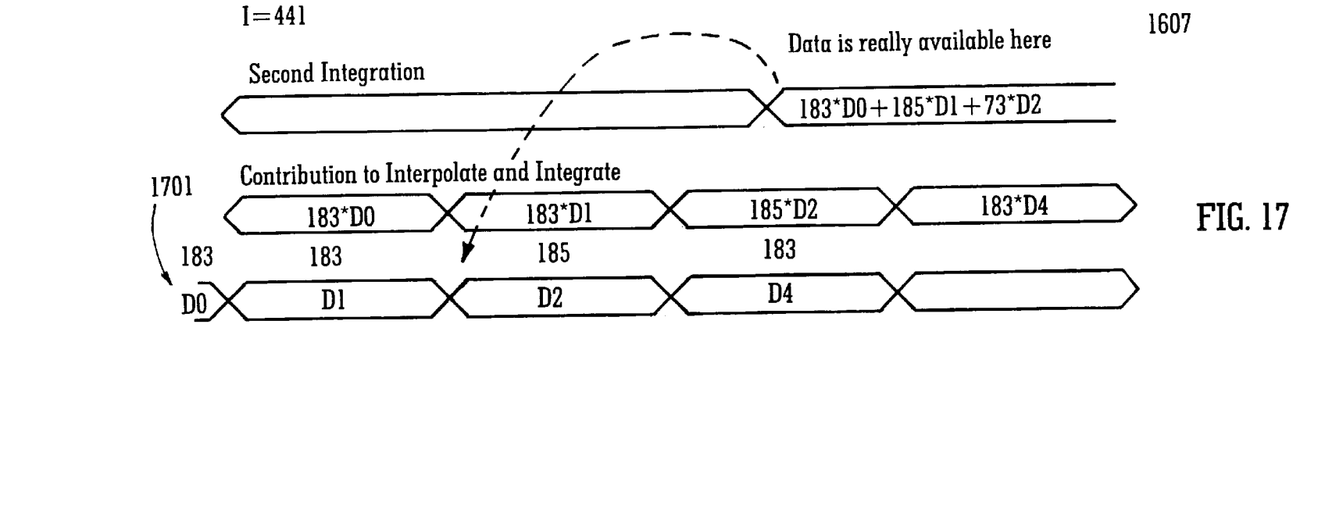
FIG. 17 is a timing diagram illustrating operation of the decimating SRC of FIG. 16.

The interpolate and integrate stage is influenced on a sample-by-sample basis, by the numbers arriving from the frequency modulator (1206 of FIG. 12), in order to realize non-uniform sampling. This is further illustrated in the timing diagram of FIG. 17, wherein the input data 1701 is multiplied by frequency modulator data yielding the values 183×D0, 183×D1, 185×D2, which are the result of input data being interpolated at the non-uniform rate and subsequently integrated.

One skilled in the art will appreciate the fact that a data stream of digital input samples can be modulated at an oversampling rate equal to the frequency of a noise-shaped clock signal. This process can be implemented using sigma-delta modulators. The general subject of sample rate conversion at variable rates is discussed at length in U.S. Pat. No. 5,892,468, U.S. Pat. No. 5,963,160, U.S. Pat. No. 5,497,152, U.S. Pat. No. 5,489,903, and U.S. Pat. No. 5,512,897, all of which are incorporated by reference thereto just as though fully set forth herein.

Figure 18:
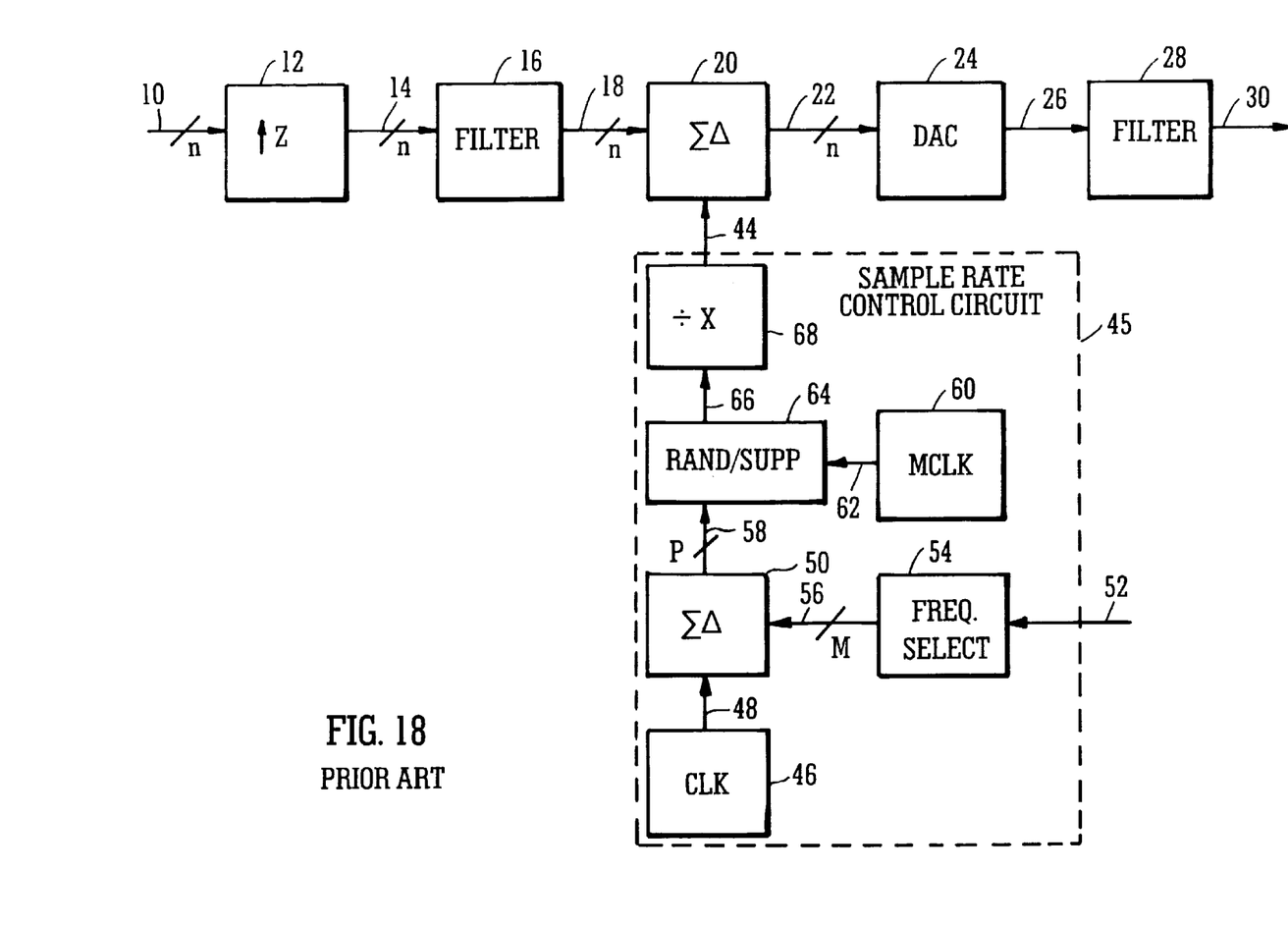
FIG. 18 is a block diagram broadly illustrating one embodiment of a variable sample rate digital-to-analog converter (DAC) system of the prior art.

FIG. 18 is a block diagram broadly illustrating one embodiment of a variable sample rate digital-to-analog converter (DAC) system. The system includes an upsample element 12 receiving digital input samples on n-bit bus 10 at an input sample rate. Upsample element 12 conventionally upsamples the digital input samples by the interpolation ratio Z and provides the upsampled samples on n-bit bus 14 to filter 16. Digital filter 16 conventionally reduces images of the upsampled digital samples and provides the filtered upsampled samples on n-bit bus 18 to sigma-delta modulator 20.

Sigma-delta modulator 20 conventionally performs noise shaping on the upsampled filtered samples at an oversampling rate controlled by a noise-shaped clock signal received on line 44. The sigma-delta modulator 20 is an n-bit modulator that provides a modulated data stream on n-bit bus 22 to DAC 24 which converts the modulated data stream to an analog signal. The analog signal is provided on line 26 to analog low pass filter 28 which reduces the high frequency quantization noise component of the analog signal and provides an analog output signal on line 30.

The overall purpose of the circuit is to produce digital input samples on bus 22 at an oversampling rate equal to an oversampling ratio times a preselected input sample rate, which may be any rate within a certain range. The preselected input sample rate is input on line 52 to the sample rate control circuit 45 which, in response, computes a clock signal and provides that clock signal on line 44 to control the sample rate of modulator 20. Because the sample rate of the modulator 20 is proportional to the oversampling ratio of the system, the sample rate control circuit 45 controls, at least in part, the oversampling ratio, as will be described in greater detail below. The fixed interpolation ratio Z of upsample element 12 preferably is equal to the oversampling ratio. The preselected input sample rate can be any frequency value within a certain range, and can be independent of the frequency of a master clock signal of the system.

From a user-inputted desired input sample rate received on line 52, sample rate control circuit 45 produces a clock signal on line 44 which has a sigma-delta noise-shaped characteristic. Frequency select circuit 54 produces, from the desired output sample rate input signal, an M-bit digital frequency select signal representing the desired input sample rate. Digital sigma-delta modulator 50 receives the frequency select signal on bus 56 and sigma-delta modulates the frequency select signal to produce a P-bit output code on bus 58. Sigma-delta modulator 50 operates at a constant rate controlled by clock 46. A clock signal produced by clock 46 is provided to sigma-delta modulator 50 on line 48.

Randomizer/suppressor circuit 64 receives a master clock signal as an input on line 62 from master clock circuit 60 and, by control of the P-bit output code of sigma-delta modulator 50, allows a certain number of master clock signals within a set number of such signals to be outputted on line 66. In other words, a clock signal equal to a fraction (from 0 to 1) of the master clock signal will be outputted by the randomizer/suppressor circuit, the fraction depending on the P-bit code outputted by the sigma-delta modulator. The randomizer/suppressor circuit can be any one of such circuits well-known in the art. One example of such a circuit is described in *Phase Lock Loops, Theory, Design, and Applications* by Roland E. Best, published by McGraw-Hill Book Company, 1984. The clock signal outputted on line 66 has a sigma-delta noise-shaped characteristic due to the control of the sigma-delta code output on bus 58.

The noise-shaped clock signal on line 66 then can be frequency-adjusted by frequency divider 68 and provided on line 44 to control the rate of operation of modulator 20. Frequency divider 68 reduces the frequency of the noise-shaped output signal received on line 66 by a constant factor of X. Divider 68 may be implemented with a counter, as will be understood by those skilled in the art. This factor X is selected to achieve a desired oversampling ratio of the DAC system. The frequency of the clock signal on line 66 is related to the preselected sample rate inputted on line 52 and the master clock signal produced by master clock 60, which is known. Thus, the ratio of the clock signal produced on line 66 to the preselected input sample rate is known and thereby factor X of divider 68 can be preselected to achieve a desired oversampling ratio to suit a particular application.

An example of the operation of the DAC system follows. Assume that the clock signal produced on line 48 by clock 46 is 3.072 MHz. Therefore, sigma-delta modulator 50 operates at 3.072 MHz. Additionally, assume that the master clock signal received on line 62 from master clock 60 is 24.576 MHz. If the desired input sample rate of the digital input samples received on bus 10 is 48 kHz, then a user would enter 48 kHz on line 52. Frequency select circuit 54 would produce, based on the 48 kHz input signal, an M-bit frequency select signal on line 56 representing the desired input data rate of 48 kHz. It should be understood that the number of bits M in the frequency select signal controls the precision with which the DAC system can achieve the desired input sample rate.

The frequency select signal is sigma-delta modulated by sigma-delta modulator 50 at the rate of 3.072 MHz and a P-bit output code is provided on bus 58. The P-bit output code of sigma-delta modulator 50 has a sigma-delta noise-shaped characteristic and controls randomizer/suppressor circuit 64 to adjust the frequency of the 24.576 MHz master clock signal received on line 62. Specifically, the output code of the sigma-delta modulator 50 controls the randomizer/suppressor circuit 54 to pass a fraction of the master clock signal. In this particular example, with a desired input sample rate of 48 kHz, preferably 6 out of 8 master clock signals are outputted to line 66. In other words, ¾ of the 24.576 MHz master clock signal, or an 18.432 MHz clock signal, is provided on line 66. This 18.432 MHz clock signal has a noise-shaped frequency characteristic and is approximately equal (depending on the resolution of the system) to 384 times the desired input sample rate of 48 kHz.

The 18.432 MHz clock signal can then be frequency adjusted by divider 68 to adjust the oversampling ratio of the DAC. If an oversampling ratio of 384 is desired, then further division by divider 68 is not necessary and a factor X of 1 is used. If, alternatively, an oversampling ratio of 64 is desired, then the factor X is set to 6 and the 18.432 clock signal is divided by a factor of 6 by divider 68 and the resulting 3.072 MHz clock signal is provided on line 44 to control the rate of operation of the modulator. It is noted that the 3.072 MHz signal is 64 times the desired input rate of 48 kHz (i.e., an oversampling ratio of 64). Thus, in this example, the interpolation ratio Z of upsample element 12 would be set to 64 to produce input samples on bus 18 at the desired input sample rate of 64 times 48 kHz.

As will be appreciated by those skilled in the art, the oversampling ratio of the DAC system, set in part by factor X of divider 68, is proportional to the signal-to-noise ratio of the DAC system. A higher oversampling ratio produces a higher signal-to-noise ratio and a more accurate output. A higher oversampling ratio, however, requires a larger interpolation ratio which necessitates longer filters that are more difficult and expensive to accurately implement. Consequently, as will be understood by those skilled in the art, a balance must be struck between the desire for a higher oversampling ratio and the practical limitations on large digital filters.

Sigma-delta modulator 50 preferably is an N-th order, P-bit modulator. A higher order sigma-delta modulator will typically produce output samples with greater noise-shaped characteristics (i.e., a higher signal-to-noise ratio). The sigma-delta modulator is chosen to produce a P-bit output code (where P≧1 in a preferred embodiment) because, as the number of bits in the output code is increased, the clock rate necessary to operate the sigma-delta modulator 50 is reduced. It is to be appreciated, however, that the system described is not so limited. Sigma-delta modulator 50 could alternatively be a 1-bit modulator if the clock frequency received on line 48 and used to clock the modulator is appropriately increased.

A key feature of the system of FIG. 18 is that the temporal spacing of the sampling points is controlled by the N-th order, P-bit sigma-delta modulator such that any errors (i.e., noise on the sampling points) produced by the non-uniform sampling are shaped ("noise-shaped") to a high frequency range. As is well-known in the field of sigma-delta systems, the shaped noise errors can be reduced by conventional filtering techniques.

Several other advantages also are obtained. By appropriate choice of the rate at which the sigma-delta spaced sampling points are generated, and the number of bits used in controlling the spacing of those sampling points, the signal-to-noise ratio of the system can be controlled. Additionally, the degree of filtering used on the analog output signal on line 26 can also be varied to adjust the signal-to-noise ratio to suit a particular application.

There has been described herein a sample rate converter that offers distinct advantages when compared with the prior art. It will be apparent to those skilled in the art that modifications may be made without departing from the spirit and scope of the invention. Accordingly, it is not intended that the invention be limited except as may be necessary in view of the appended claims.

What is claimed is:

1. An improved interpolating sample rate converter that operates on an input data stream to perform upsampling, filtering, and downsampling of the input data stream to produce an output data stream having a higher sample rate than the input data stream, wherein the improvement comprises:

a cascaded integrator-comb filter performs at least a part of the upsampling and filtering of the input data stream; and downsampling is conducted at an instantaneously variable rate.

2. The improved interpolating sample rate converter of claim 1, wherein downsampling is conducted at an instantaneously variable rate through a digital sigma-delta modulator that controls downsampling on a sample-by-sample basis to implement non-uniform downsampling.

3. The improved interpolating sample rate converter of claim 2, wherein the output of the sigma-delta modulator is divided to provide a clock signal having a fixed frequency and a non-uniform period.

4. An improved decimating sample rate converter that operates on an input data stream to perform upsampling, filtering, and downsampling of the input data stream to produce an output data stream having a lower sample rate than the input data stream, wherein the improvement comprises:

a cascaded integrator-comb filter performs at least a part of the filtering and downsampling of the input data stream; and upsampling is conducted at an instantaneously variable rate.

5. The improved decimating sample rate converter of claim 4, wherein upsampling is conducted at an instantaneously variable rate through a digital sigma-delta modulator that controls upsampling on a sample-by-sample basis to implement non-uniform upsampling.

6. The improved decimating sample rate converter of claim 5, wherein the output of the sigma-delta modulator is divided to provide a clock signal having a fixed frequency and a non-uniform period.

7. An interpolating sample rate converter that provides rate conversion by a factor of M/N comprising:

an upsampler that upsamples an input data stream by a factor of M;

a filter that shapes the upsampled data stream in accordance with a predetermined power spectrum; and a downsampler that downsamples the upsampled and shaped signal by a factor of N to produce an output data stream;

wherein the upsampler and filter are implemented, at least in part, by a cascaded integrator-comb filter; and wherein the upsampling factor M is a natural number and the downsampling factor N is a rational number but not necessarily a natural number.

8. The interpolating sample rate converter of claim 7, wherein the predetermined power spectrum is proportional to $sinc^2$.

9. The interpolating sample rate converter of claim 7, further comprising a sigma-delta modulator that provides noise-shaped control of the N value for the downsampler.

10. The interpolating sample rate converter of claim 9, wherein the sigma-delta modulator controls downsampling on a sample-by-sample basis to implement non-uniform downsampling.

11. The interpolating sample rate converter of claim 10, wherein the output of the sigma-delta modulator is divided to provide a clock signal having a fixed frequency and a non-uniform period.

12. A decimating sample rate converter that provides rate conversion by a factor of M/N comprising:

an upsampler that upsamples an input data stream by a factor of M;

a filter that shapes the upsampled data stream in accordance with a predetermined power spectrum; and a downsampler that downsamples the upsampled and shaped signal by a factor of N to produce an output data stream;

wherein the filter and downsampler are implemented, at least in part, by a cascaded integrator-comb filter; and wherein the upsampling factor M is a rational number but not necessarily a natural number and the downsampling factor N is a natural number.

13. The decimating sample rate converter of claim 12, wherein the predetermined power spectrum is proportional to $sinc^2$.

14. The decimating sample rate converter of claim 12, further comprising a sigma-delta modulator that provides noise-shaped control of the M value for the upsampler.

15. The decimating sample rate converter of claim 14, wherein the sigma-delta modulator controls upsampling on a sample-by-sample basis to implement non-uniform upsampling.

16. The decimating sample rate converter of claim 15, wherein the output of the sigma-delta modulator is divided to provide a clock signal having a fixed frequency and a non-uniform period.

17. A method for sample rate conversion of a digital input signal, the method comprising the steps of:
   (a) providing an input digital data stream at an input sample rate;
   (b) filtering and interpolating the input digital data stream by an integer value I utilizing, at least in part, a cascaded integrator-comb filter; and
   (c) decimating the interpolated input digital data stream by an instantaneously variable value V to provide an output digital data stream at an output sample rate.

18. The method in accordance with claim 17, wherein the step (c) of decimating the interpolated input digital data stream by an instantaneously variable value V further comprises the step of deriving the instantaneously variable value V through a digital sigma-delta modulator that controls downsampling on a sample-by-sample basis to implement nonuniform downsampling.

19. A method for sample rate conversion of a digital input signal, the method comprising the steps of:
   (a) providing an input digital data stream at an input sample rate;
   (b) interpolating the input digital data stream by an instantaneously variable value V; and
   (c) filtering and decimating the interpolated input digital data stream by a value I utilizing, at least in part, a cascaded integrator-comb filter, to provide an output digital data stream at an output sample rate.

20. The method in accordance with claim 19, wherein the step (b) of interpolating the input digital data stream by an instantaneously variable value V further comprises the step of deriving the instantaneously variable value V through a digital sigma-delta modulator that controls upsampling on a sample-by-sample basis to implement non-uniform upsampling.

21. A sample rate converter for a digital input signal comprising:
   means for providing an input digital data stream at an input sample rate;
   means for filtering and interpolating the input digital data stream by an integer value I utilizing, at least in part, a cascaded integrator-comb filter; and
   means for decimating the interpolated input digital data stream by an instantaneously variable value V to provide an output digital data stream at an output sample rate.

22. The sample rate converter of claim 21, wherein the means for decimating the interpolated input digital data stream by an instantaneously variable value V comprises means for deriving the instantaneously variable value V through a digital sigma-delta modulator means that controls downsampling on a sample-by-sample basis to implement non-uniform downsampling.

23. A sample rate converter for a digital input signal comprising:
   means for providing an input digital data stream at an input sample rate;
   means for interpolating the input digital data stream by an instantaneously variable value V; and
   means for filtering and decimating the interpolated input digital data stream by a value I utilizing, at least in part, a cascaded integrator-comb filter, to provide an output digital data stream at an output sample rate.

24. The sample rate converter of claim 23, wherein the means for interpolating the input digital data stream by an instantaneously variable value V comprises means for deriving the instantaneously variable value V through a digital sigma-delta modulator means that controls upsampling on a sample-by-sample basis to implement non-uniform upsampling.

* * * * *